(12) United States Patent
Lee

(10) Patent No.: US 9,105,630 B2
(45) Date of Patent: Aug. 11, 2015

(54) SEMICONDUCTOR MEMORY APPARATUS FOR IMPROVING CHARACTERISTICS OF POWER DISTRIBUTION NETWORK

(71) Applicant: SK hynix Inc., Icheon-si Gyeonggi-do (KR)

(72) Inventor: Jae Young Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/100,898

(22) Filed: Dec. 9, 2013

(65) Prior Publication Data

US 2015/0091184 A1 Apr. 2, 2015

(30) Foreign Application Priority Data

Sep. 30, 2013 (KR) .................. 10-2013-0116401

(51) Int. Cl.
*H01L 23/522* (2006.01)
*H01L 23/50* (2006.01)
*H01L 23/528* (2006.01)
*H01L 23/58* (2006.01)

(52) U.S. Cl.
CPC ............ *H01L 23/50* (2013.01); *H01L 23/5286* (2013.01); *H01L 23/58* (2013.01)

(58) Field of Classification Search
CPC ..... H01L 23/5226; H01L 23/50; H01L 23/58; H01L 23/5286; H01L 23/522
USPC ......... 257/774, 698, 686, 723, 401, 762, 784, 257/531, E27.06, E27.062, 368, 369, 296, 257/E27.084, 487, E29.174, 355
See application file for complete search history.

(56) References Cited

U.S. PATENT DOCUMENTS

| | | | |
|---|---|---|---|
| 7,986,542 B2 * | 7/2011 | Oosaka ........................ | 365/63 |
| 8,411,450 B2 * | 4/2013 | Yamazaki et al. ............ | 361/749 |
| 2005/0090128 A1 * | 4/2005 | Nishizawa et al. ............ | 439/79 |
| 2006/0037703 A1 * | 2/2006 | Koshiishi et al. ......... | 156/345.47 |
| 2006/0104101 A1 * | 5/2006 | Chen et al. ...................... | 365/63 |
| 2007/0253276 A1 * | 11/2007 | Ochi ............................. | 365/233 |
| 2007/0278580 A1 * | 12/2007 | Kondo et al. ................. | 257/355 |
| 2008/0001296 A1 * | 1/2008 | Tu et al. ........................ | 257/762 |
| 2009/0140370 A1 * | 6/2009 | Jou et al. ....................... | 257/487 |
| 2011/0292717 A1 * | 12/2011 | Ohgami ........................ | 365/149 |
| 2012/0292712 A1 * | 11/2012 | Baek et al. .................... | 257/369 |
| 2013/0285198 A1 * | 10/2013 | Kihara .......................... | 257/531 |

FOREIGN PATENT DOCUMENTS

| | | |
|---|---|---|
| KR | 1020110123385 A | 11/2011 |
| KR | 1020120097981 A | 9/2012 |

* cited by examiner

*Primary Examiner* — Alexander Oscar Williams
(74) *Attorney, Agent, or Firm* — William Park & Associates Ltd.

(57) ABSTRACT

A semiconductor memory apparatus includes: a power distribution line disposed over a circumferential portion of a device formation region; a guard ring formed to surround the device formation region outside of the power distribution line; and one or more power reinforcement parts configured to electrically couple an edge part of the power distribution line to the guard ring.

19 Claims, 6 Drawing Sheets

SEMICONDUCTOR MEMORY APPARATUS FOR IMPROVING CHARACTERISTICS OF POWER DISTRIBUTION NETWORK

CROSS-REFERENCES TO RELATED APPLICATION

The present application claims priority under 35 U.S.C. §119(a) to Korean application number 10-2013-0116401, filed on Sep. 30, 2013, in the Korean Intellectual Property Office, which is incorporated herein by reference in its entirety.

BACKGROUND

1. Technical Field

Various embodiments relate to an integrated circuit apparatus, and more particularly, to a semiconductor memory apparatus.

2. Related Art

The integration degree, capacity, and speed of semiconductor memory apparatuses have been continuously increased. In particular, the distribution rate of mobile devices has increased day by day, and the mobile devices have required a variety of functions. Thus, a memory apparatus to be applied to the mobile devices is required to have high performance.

Therefore, current consumption of a semiconductor memory chip further increases. When the voltage is dropped by impedance of a power distribution line within the semiconductor memory chip, a voltage which is actually applied to a device becomes lower than a supplied voltage, thereby having a bad influence on circuit operating characteristics.

Recently, much attention has been paid to a power distribution network (PDN), in order to prevent a power shortage during an operation of a semiconductor memory chip. When the PDN is designed, a decoupling capacitor may be disposed or a power line may be disposed in a mesh shape. However, much research is needed to improve the voltage drop of the entire chip.

SUMMARY

In an embodiment of the present invention, a semiconductor memory apparatus includes: a power distribution line disposed over a circumferential portion of a device formation region; a guard ring formed to surround the device formation region outside of the power distribution line; and one or more power reinforcement parts configured to electrically couple an edge part of the power distribution line to the guard ring.

In an embodiment of the present invention, a semiconductor memory apparatus includes: a power distribution line disposed over a circumferential portion of a device formation region; a guard ring formed to surround an outside of the device formation region and the power distribution line, in which a plurality of wiring layers are stacked; and one or more power reinforcement parts configured to electrically couple an edge part of the power distribution to the guard ring, and coupled between the power distribution line and a wiring layer of the guard ring at a different layer from a layer at which the power distribution line is formed.

In an embodiment of the present invention, a semiconductor memory apparatus includes: a power distribution line disposed over a circumferential portion of a device formation region; a guard ring formed to surround the device formation region and the power distribution line, and including a first guard ring part formed at the device formation region and a second guard ring part formed at a scribe lane; and one or more power reinforcement parts configured to electrically couple an edge part of the power distribution line to the first guard ring part.

In an embodiment of the present invention, a system comprises: a processor; a controller configured to receive a request and a data from the processor; and a memory unit configured to receive the request and the data from the controller, wherein the memory unit includes: a power distribution line disposed over a circumferential portion of a device formation region; a guard ring formed to surround the device formation region outside of the power distribution line; and one or more reinforcement parts configured to electrically couple an edge part of the power distribution line to the guard ring.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the invention will be described below with reference to the accompanying drawings through various embodiments.

Figure 1:
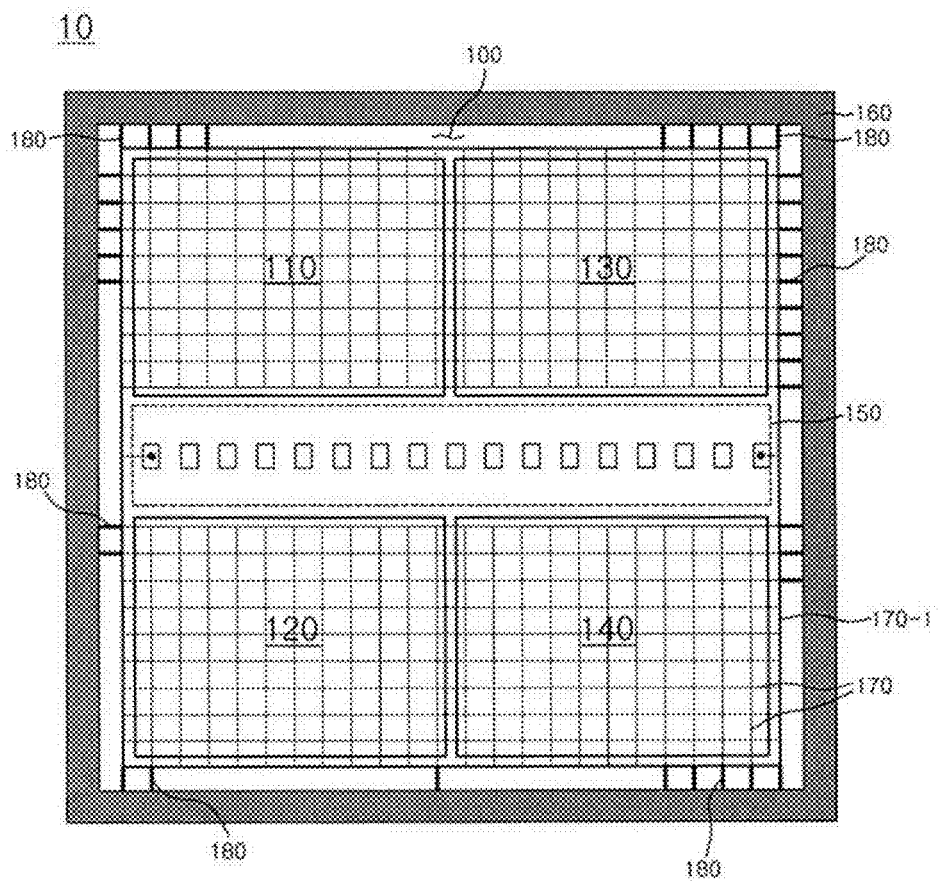
FIG. 1 is a plan view of a semiconductor memory apparatus according to an embodiment of the present invention.

FIG. 1 is a plan view of a semiconductor memory apparatus according to an embodiment of the present invention.

Referring to FIG. 1, the semiconductor memory apparatus 10 may include one or more banks 110, 120, 130, and 140. Each of the memory banks 110, 120, 130, and 140 may include a plurality of unit memory cell arrays (not illustrated) and a circuit such as a decoder (not illustrated) configured to select a memory cell according to an address of a memory cell to be accessed.

A peripheral circuit region 150 may be disposed at one side of the banks 110, 120, 130 and 140. The peripheral circuit region 150 may include an address/command processing unit, a data input/output processing unit, a power supply unit and the like. The peripheral circuit region 150 may further include a data input/output pad, an address pad, a command pad, a power supply pad (power supply voltage pad and ground voltage pad) and the like.

A guard ring 160 is formed outside a device formation region 100 including the banks 110, 120, 130, and 140 and the peripheral circuit region 150. The guard ring 160 may be formed to surround the device formation region 100 outside of a power distribution line 170.

During a fabrication process for a semiconductor apparatus, a plurality of devices are formed over one semiconductor wafer, and the semiconductor wafer is cut along a dicing line or scribe lane so as to be separated into a plurality of individual chips.

That is, a scribe lane region is a region for separating a semiconductor wafer into a plurality of chips. Through the sidewalls of the scribe lane region, the interfaces of a large number of interlayer dielectric layers stacked during a device formation process are exposed. The interfaces may serve as a water penetration path to cause a malfunction or damage of a semiconductor chip or reduce a yield. Furthermore, a crack may occur in the interlayer dielectric layers due to stress applied during the dicing process. This crack may also serve as a water penetration path.

Thus, a structure to surround the device formation region 100, that is, the guard ring 160 is formed outside the device formation region 100 so as to prevent water penetration or stress propagation.

A power distribution line 170 is formed over the banks 110, 120, 130, and 140 within the device formation region 100. The power distribution line 170 may be disposed over the device formation region 100 and a circumferential portion of the device formation region 100. The power distribution line 170 made of a conductive material is connected in a mesh shape over the device formation region 100 and a circumferential portion of the device formation region 100 so as to form a power distribution network. The power distribution line 170 is coupled to a power supply pad of the peripheral circuit region 150, that is, a power supply voltage pad or ground voltage pad, and may include an edge part 170-1 to surround the edge of the device formation region 100. The power supply pad may be formed at a designated position within the device formation region 100. The power distribution line 170 may transmit a voltage supplied from the power supply pad to the device formation region.

The guard ring 160 and the edge part 170-1 of the power distribution line 170 are coupled to each other through a power reinforcement part 180.

The power reinforcement part 180 may be formed by electrically coupling a specific layer of the guard ring 160 including a plurality of layers to the power distribution line 170. Desirably, the power reinforcement part 180 may include a wiring pattern formed when the guard ring 160 is formed.

The power distribution line 170 may correspond to a wiring layer which is formed at the uppermost layer after devices are formed in the device formation region 100, that is, the banks 110, 120, 130, and 140 and the peripheral circuit region 150. Furthermore, the guard ring 160 may be formed by stacking a plurality of wiring layers so as to have the same height as the device formation region 100.

Thus, the power reinforcement part 180 may be formed by coupling one or more wirings between the uppermost layer of the guard ring 160 and the edge part 170-1 of the power distribution line 170 formed over a circumferential portion. Alternatively, the layers of the guard ring 160 excluding the uppermost layer may be coupled to the edge part 170-1 of the power distribution line 170 through a wiring. In this case, a via contact may be formed in a vertical direction from the edge part 170-1 of the power distribution line 170, and the power reinforcement part 180 extended from the guard ring 160 and the edge part 170-1 of the power distribution line 170 may be coupled to each other through the via contact. One or more power reinforcement parts 180 may be configured to electrically couple an edge part of the power distribution line 170 formed over the circumferential portion to the guard ring 160.

Figure 2:
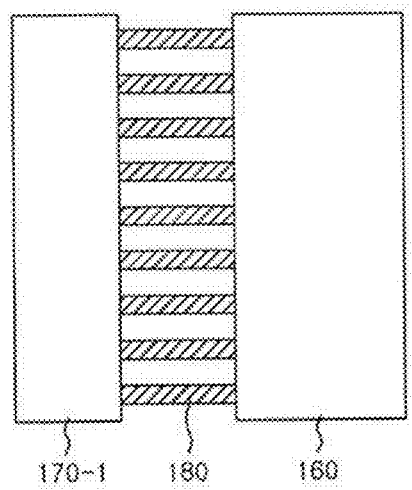
FIG. 2 is a diagram illustrating an example of a power reinforcement part illustrated in FIG. 1.

FIG. 2 is a diagram illustrating an example of the power reinforcement part illustrated in FIG. 1.

In an embodiment, the power reinforcement part 180 is formed to electrically couple the guard ring 160 and the edge part 170-1 of the power distribution line 170 at the same layer.

For example, the power reinforcement part 180 electrically couples the edge part 170-1 of the power distribution line 170 formed at the uppermost layer of the semiconductor memory chip to the uppermost layer of the guard ring 160.

Figure 3:
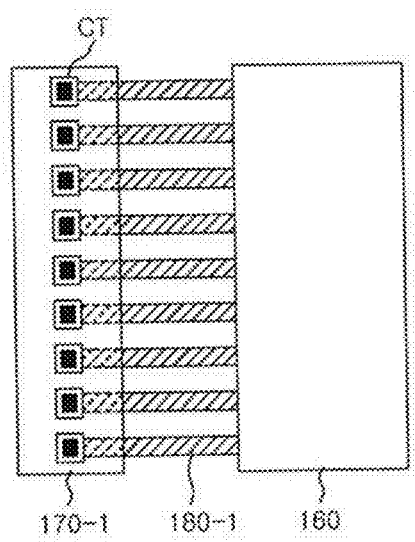
FIG. 3 is a diagram illustrating another example of the power reinforcement part illustrated in FIG. 1

FIG. 3 is a diagram illustrating an example of the power reinforcement part illustrated in FIG. 1.

In an embodiment, the power reinforcement part 180-1 is extended from the guard ring 160. More specifically, the power reinforcement part 180-1 is extended from the guard ring 160 at a lower layer than a layer at which the power distribution line 170 is formed. Furthermore, a via contact CT is vertically formed in the edge part 170-1 of the power distribution line 170, and the power reinforcement part 180-1 and the edge part 170-1 of the power distribution line 170 are electrically coupled through the via contact CT.

FIGS. 4 and 5 are graphs for comparing voltage drops of the semiconductor memory apparatus depending on whether the power reinforcement part is provided or not.

Figure 4A:
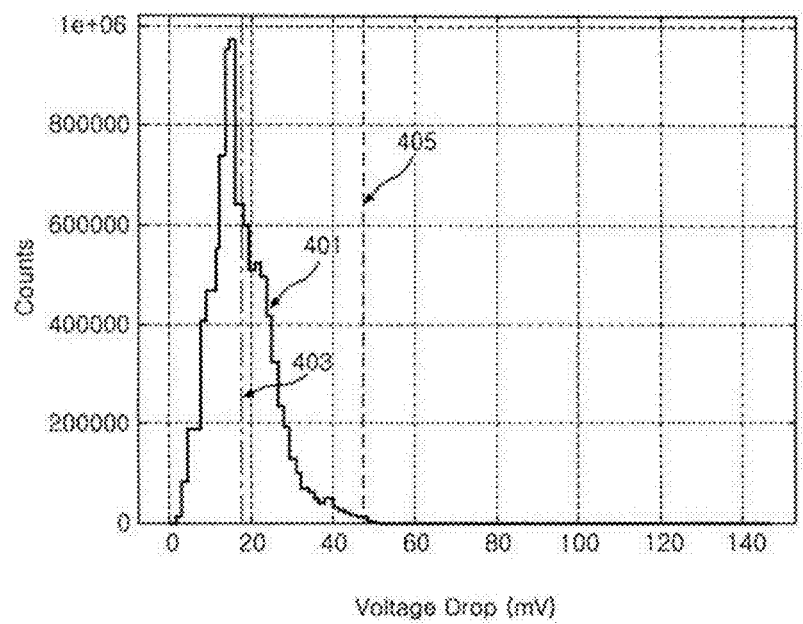
FIGS. 4(A), 4(B) and 5(A) and 5(B) are graphs for comparing voltage drops of the semiconductor memory apparatus depending on whether the power reinforcement part is provided or not.
Figure 4B:
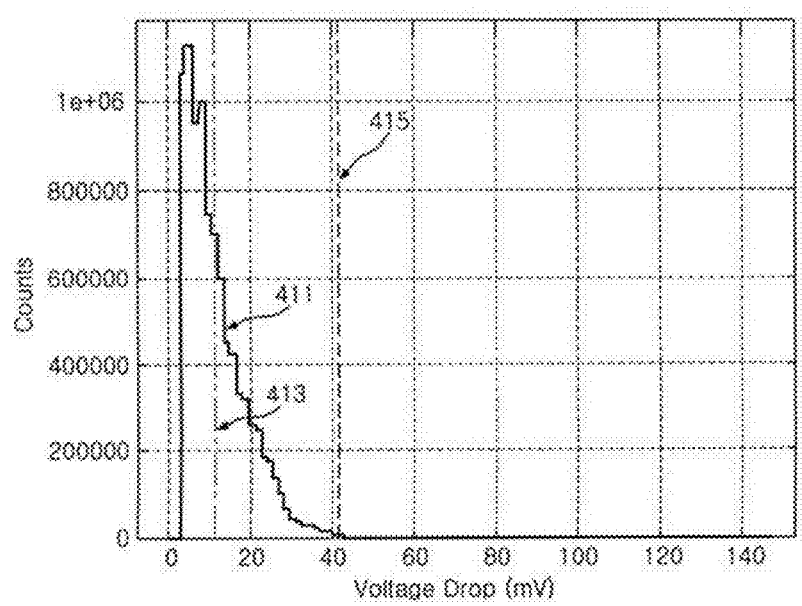

FIG. 4A is a graph illustrating voltage drops of the semiconductor memory apparatus when the power reinforcement unit 180 is provided, and FIG. 4B is a graph illustrating voltage drops of the semiconductor memory apparatus when the power reinforcement unit 180 is not provided.

More specifically, FIG. 4A illustrates a result obtained by measuring power at preset power measurement points, when the power reinforcement part 180 is not provided. That is, when the number of measurement points at which a voltage drop occurred is counted according to how much a voltage applied to a device drops from a supplied voltage, reference numeral 401 represents the count result. In this case, an average voltage drop 403 is about 16.823 mV, and a peak voltage drop 405 is 46.675 mV. FIG. 4A illustrates the voltage drop in relation to Counts.

Referring to FIG. 4B, it can be seen that the voltage drop decreases at each measurement point as indicated by reference numeral 411, when the semiconductor memory apparatus includes the power reinforcement part 180. Furthermore, an average voltage drop 413 decreases to 10.853 mV, and a peak voltage drop 415 also decreases to 40.841 mV. FIG. 4B illustrates the voltage drop in relation to the Counts.

Figure 5A:
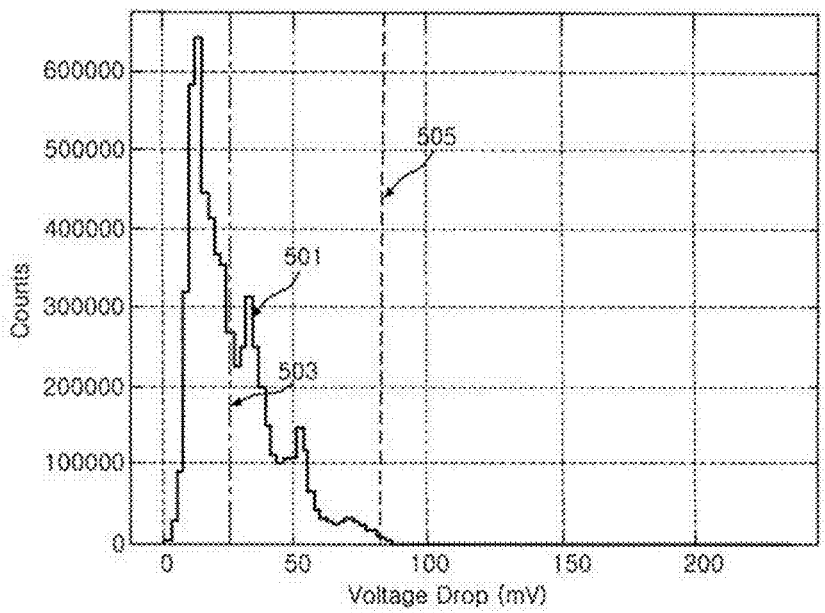
Figure 5B:
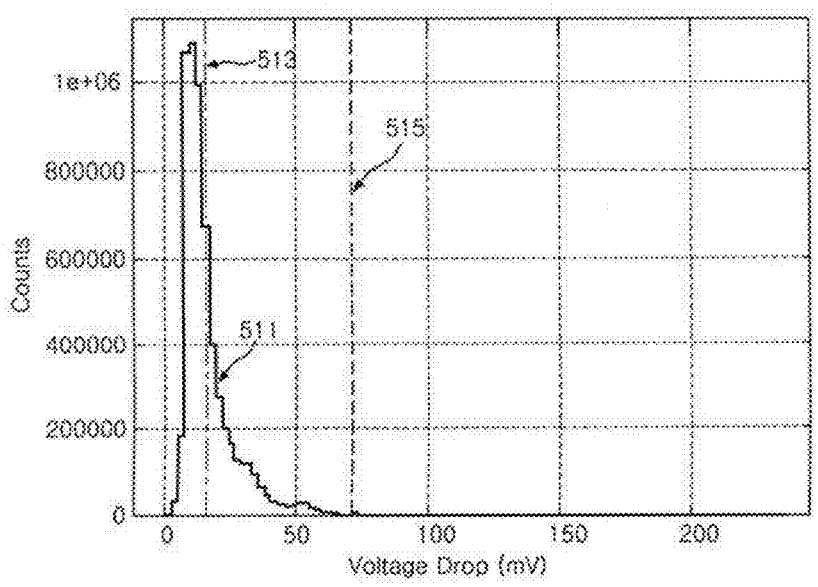

FIG. 5A is a graph illustrating voltage drops of another semiconductor memory apparatus when the power reinforcement unit 180 is provided, and FIG. 5B is a graph illustrating voltage drops of the semiconductor memory apparatus when the power reinforcement unit 180 is not provided.

More specifically, FIG. 5A illustrates a result obtained by measuring power at preset power measurement points. When the number of measurement points at which a voltage drop occurred is counted according to how much a voltage applied to a device drops from a supplied voltage, reference numeral 501 represents the count result. In this case, an average voltage drop 503 is about 34.806 mV, and a peak voltage drop 505 is 82.082 mV. FIG. 5A illustrates the Voltage Drop (V) in relation to Counts.

Referring to FIG. 5B, it can be seen that the voltage drop decreases at each measurement point as indicated by reference numeral 511, when the semiconductor memory apparatus includes the power reinforcement part 180. Furthermore, an average voltage drop 513 decreases to 15.376 mV, and a peak voltage drop 515 also decreases to 70.356 mV. FIG. 5B illustrates the Voltage Drop (V) in relation to Counts.

Through the electrical coupling between the guard ring and the power distribution line, it is possible to efficiently suppress the voltage drop caused by the impedance within the chip.

Figure 6:
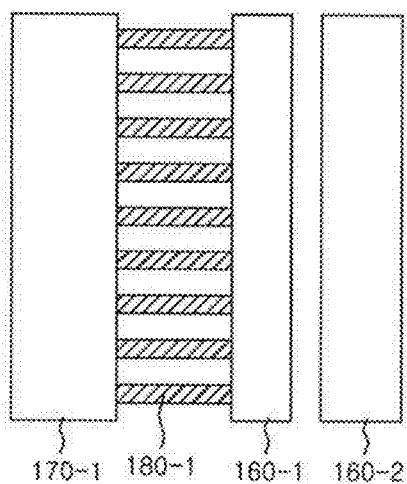
FIG. 6 is a diagram illustrating a guard ring which is applied in an embodiment to the present invention.

FIG. 6 is a diagram illustrating a guard ring and a power reinforcement part according to an embodiment of the present invention.

Referring to FIG. 6, the guard ring may include a first guard ring part 160-1 formed at the device formation region 100 and a second guard ring part 160-2 formed at the scribe lane. That is, the guard ring 160 is separated into an inner part and an outer part.

During a dicing process for separating a semiconductor wafer into a plurality of chips through the scribe lane, the guard ring may collapse or an interface of the device formation region 100 may be exposed, due to the stress applied to the guard ring. However, when the guard ring is constructed at two stages as illustrated in FIG. 6, the devices may be protected by the first guard ring part 160-1 surrounding the device formation region 100, even though stress is applied to the second guard ring part 160-2.

Furthermore, the power reinforcement part 180-1 is electrically coupled between the first guard ring part 160-1 and the edge part 170-1 formed over a circumferential portion. In this case, the first guard ring part 160-1 and the edge part 170-1 may be coupled at the same layer or coupled at different layers through a via contact. Accordingly, one or more power reinforcement parts 180-1 may be coupled between the power distribution line 170 and a wiring layer of the guard ring 160 and/or first guard ring part 160-1 at a different layer from a layer at which the power distribution line 170 is formed, through a via contact electrically coupled to the edge part 170-1 and/or the power distribution line 170. The first guard ring part 160-1 and the second guard ring part 160-2 may have a structure in which a plurality of wiring layers are stacked. The power reinforcement part 180-1 may be coupled between the power distribution line 170 and a wiring layer of the first guard ring part 160-1 at the same layer as a layer at which the power distribution line 170 is formed.

Figure 7:
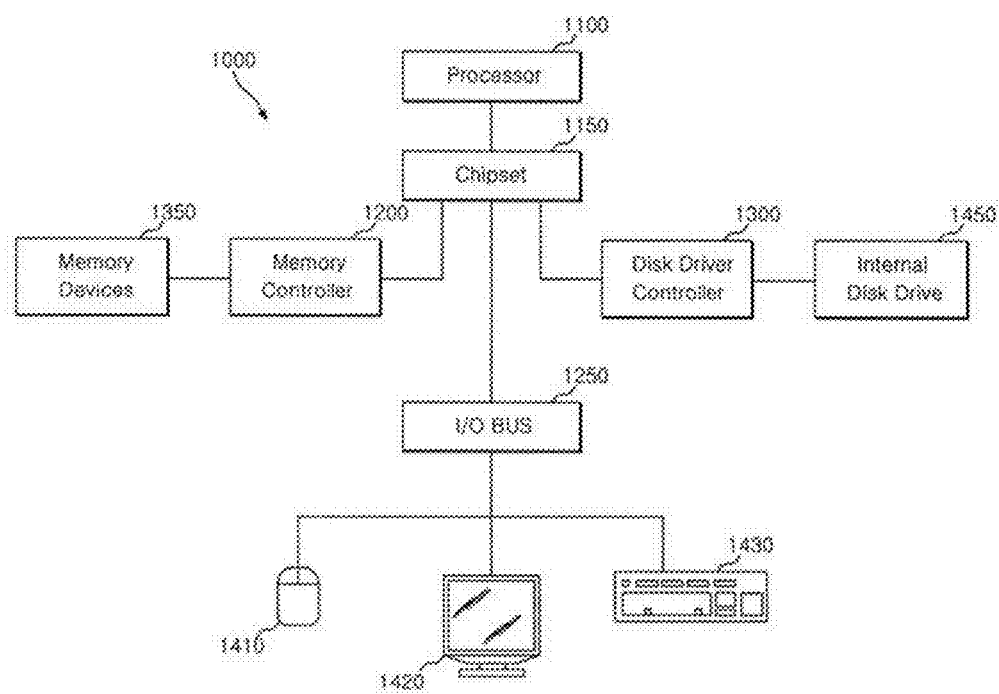
FIG. 7 illustrates a block diagram of a system employing a memory controller circuit in accordance with an embodiment of the present invention.

Referring to FIG. 7, a block diagram of a system 1000 may include one or more processors or central processing units ("CPUs") 1100. The CPU or Processor 1100 may be used individually or in combination with other CPUs.

A chipset 1150 may be operably coupled to the Processor 1100. The chipset 1150 is a communication pathway for signals between the Processor 1100 and other components of the system 1000, which may include a memory controller 1200, an input/output ("I/O") bus 1250, and disk drive controller 1300. Depending on the configuration of the system, any one of a number of different signals may be transmitted through the chipset 1150.

The memory controller 1200 may be operably coupled to the chipset 1150. The memory controller 1200 may include at least one memory controller which delays the generation of the address signal, and blocks consecutive accesses, of which the number exceeds the predetermined critical value, to the same word line or the same bit line in memory unit. The memory controller 1200 can receive a request provided from the CPU 1100 through the chipset 1150. The memory controller 1200 may be operably coupled to one or more memory devices 1350. In an embodiment, the memory devices 1350 may correspond to the semiconductor memory apparatus described above. Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a power distribution line disposed over a circumferential portion of a device formation region;
a guard ring formed to surround the device formation region outside of the power distribution line; and
one or more power reinforcement parts configured to electrically couple an edge part of the power distribution line to the guard ring.

2. The semiconductor memory apparatus according to claim 1, further comprising a power supply pad formed at a designated position within the device formation region,
wherein the power distribution line transmits a voltage supplied from the power supply pad to the device formation region.

3. The semiconductor memory apparatus according to claim 1, wherein the guard ring has a structure in which a plurality of wiring layers are stacked, and the power reinforcement part is coupled between the power distribution line and a wiring layer of the guard ring at the same layer as a layer at which the power distribution line is formed.

4. The semiconductor memory apparatus according to claim 1, wherein the power reinforcement part comprises one or more wirings extended between the guard ring and the edge part of the power distribution line.

5. The semiconductor memory apparatus according to claim 1, wherein the power distribution line is disposed in a mesh shape over the device formation region and the circumferential portion of the device formation region.

6. A semiconductor memory apparatus comprising:
a power distribution line disposed over a circumferential portion of a device formation region;
a guard ring formed to surround an outside of the device formation region and the power distribution line, in which a plurality of wiring layers are stacked; and
one or more power reinforcement parts configured to electrically couple an edge part of the power distribution to the guard ring, and coupled between the power distribution line and a wiring layer of the guard ring at a different layer from a layer at which the power distribution line is formed.

7. The semiconductor memory apparatus according to claim 6, wherein the power reinforcement part is coupled between the power distribution line and a wiring layer of the guard ring at a different layer from the layer at which the power distribution line is formed, through a via contact electrically coupled to the edge part.

8. The semiconductor memory apparatus according to claim 6, further comprising a power supply pad formed at a designated position within the device formation region,
wherein the power distribution line transmits a voltage supplied from the power supply pad to the device formation region.

9. The semiconductor memory apparatus according to claim 6, wherein the power reinforcement part comprises one or more wirings extended between the guard ring and the edge part.

10. The semiconductor memory apparatus according to claim 6, wherein the power distribution line is disposed in a mesh shape over the device formation region and the circumferential portion.

11. A semiconductor memory apparatus comprising:
a power distribution line disposed over a circumferential portion of a device formation region;
a guard ring formed to surround the device formation region and the power distribution line, and comprising a first guard ring part formed at the device formation region and a second guard ring part formed at a scribe lane; and
one or more power reinforcement parts configured to electrically couple an edge part of the power distribution line to the first guard ring part.

12. The semiconductor memory apparatus according to claim 11, wherein each of the first and second guarding parts has a structure in which a plurality of wiring layers are stacked, and the power reinforcement part is coupled between the power distribution line and a wiring layer of the first guard ring part at the same layer as a layer at which the power distribution line is formed.

13. The semiconductor memory apparatus according to claim 11, wherein each of the first and second guarding parts has a structure in which a plurality of wiring layers are stacked, and the power reinforcement part is coupled between the power distribution line and a wiring layer of the first guard ring part at a different layer from a layer at which the power distribution line is formed, through a via contact electrically coupled to the power distribution line.

14. The semiconductor memory apparatus according to claim 11, further comprising a power supply pad formed at a designated position within the device formation region, and the power distribution line transmits a voltage supplied from the power supply pad to the device formation region.

15. The semiconductor memory apparatus according to claim 11, wherein the power reinforcement part comprises one or more wirings extended between the guard ring and the edge part.

16. The semiconductor memory apparatus according to claim 11, wherein the power distribution line is disposed in a mesh shape over the device formation region and the circumferential portion.

17. The semiconductor memory apparatus according to claim 11, wherein the guard ring is separated into an inner region and an outer region.

18. The semiconductor memory apparatus according to claim 11, wherein the first guard ring part is configured to surround the device formation region when a stress is applied to the second guard ring part.

19. The semiconductor memory apparatus according to claim 11, wherein the first guard ring part and the edge part are coupled at a same layer.

* * * * *